United States Patent [19]

Kapoor

[11] Patent Number: 5,771,187
[45] Date of Patent: Jun. 23, 1998

[54] MULTIPLE LEVEL STORAGE DRAM CELL

[75] Inventor: Ashok Kapoor, Palo Alto, Calif.

[73] Assignee: LSI Logic Corporation, Milpitas, Calif.

[21] Appl. No.: 779,994

[22] Filed: Dec. 23, 1996

[51] Int. Cl.$^6$ .................................................. G11C 11/24
[52] U.S. Cl. ........................................ 365/149; 365/168
[58] Field of Search .............................................. 365/149

[56] References Cited

U.S. PATENT DOCUMENTS

| | | | |
|---|---|---|---|
| 4,057,788 | 11/1977 | Sage | 365/174 |
| 4,316,207 | 2/1982 | Matsumoto | 365/149 |
| 4,633,438 | 12/1986 | Kume et al. | 365/51 |
| 4,661,929 | 4/1987 | Aoki et al. | 365/189 |
| 4,715,014 | 12/1987 | Tuvell et al. | 365/185 |
| 4,910,709 | 3/1990 | Dhong et al. | 365/149 |
| 4,935,896 | 6/1990 | Matsumura et al. | 365/187 |
| 5,021,999 | 6/1991 | Kohda et al. | 365/168 |
| 5,119,330 | 6/1992 | Tanagawa | 365/168 |
| 5,159,570 | 10/1992 | Mitchell et al. | 365/185 |
| 5,172,338 | 12/1992 | Mehrotra et al. | 365/185 |
| 5,282,162 | 1/1994 | Ochii | 365/189.01 |
| 5,283,761 | 2/1994 | Gillingham | 365/189.07 |
| 5,351,210 | 9/1994 | Saito | 365/189.01 |
| 5,357,464 | 10/1994 | Shukuri et al. | 365/185 |
| 5,394,362 | 2/1995 | Banks | 365/189.01 |
| 5,459,686 | 10/1995 | Saito | 365/149 |
| 5,521,865 | 5/1996 | Ohuchi et al. | 365/185.22 |
| 5,532,955 | 7/1996 | Gillingham | 365/149 |

FOREIGN PATENT DOCUMENTS 3-141097  6/1991  Japan .

OTHER PUBLICATIONS

Abbott, et al., "A 4K MOS Dynamic Random–Access Memory," IEEE Journal of Solid–State Circuits, vol. SC–8, No. 5, Oct. 1973, pp. 292–298.

*Primary Examiner*—David C. Nelms
*Assistant Examiner*—Michael T. Tran
*Attorney, Agent, or Firm*—Conley, Rose & Tayon; B. Noel Kivlin

[57] ABSTRACT

A semiconductor memory device which includes a word line, a bit line and a storage capacitor having first and second ends. A pair of FEATS each having gates coupled to the word line and one side coupled to the bit line. The other side of each FEAT is coupled to a storage capacitor upon which a selected one of four potential levels, corresponding to stored values of zero, one, two, or three, can be stored and thereafter read. One of the FEATS has a thicker gate oxide than the other and thus a higher threshold voltage. Voltage stored on the capacitor is read in two cycles thereby producing in the first cycle a high level pulse, a low level pulse, or no pulse and in the second cycle, a low level pulse or no pulse, depending upon the level of charge stored on the capacitor.

8 Claims, 4 Drawing Sheets

| Value | Bit Line Potential | | $V_{OUT1}$ 1RC | $V_{OUT1}$ 2RC | $V_{OUT2}$ 1RC | $V_{OUT2}$ 2RC |
|---|---|---|---|---|---|---|
| | 1st Read Cycle (1RC) | 2nd Read Cycle (2RC) | | | | |
| 0 | 0 | 0 | 0 | 0 | 0 | 0 |
| 1 | V1 | 0 | 1 | 0 | 0 | 0 |
| 2 | V2 | 0 | 1 | 0 | 1 | 0 |
| 3 | V3 | V1 | 1 | 1 | 1 | 0 |

MULTIPLE LEVEL STORAGE DRAM CELL

BACKGROUND OF THE INVENTION

1. Field of the Invention

The present invention relates generally to semiconductor DRAM (dynamic random access memory) cells and more particularly, to such cells which are capable of storing more than two voltage levels.

2. Description of the Related Art

Semiconductor memories capable of storing more than two voltage levels in a single cell are known in the art. For example, some prior art systems utilize a conventional DRAM cell of the type having a capacitor in series with a FEAT (field effect transistor) which is turned on and off to store charge on a capacitor in the cell or to read a charge level stored thereon. In a conventional binary storage cell, the absence of charge is a zero binary value while the presence of charge is a one binary value.

In such prior art cells, a value stored on the capacitor in the cell is read by applying the charge to a current sense amplifier. A reference voltage substantially half way between zero and the charge level indicative of a binary one is also applied to the sense amplifier. If the value stored on the capacitor is greater than the reference value, the sense amplifier generates a binary one output. If the value stored on the capacitor in the memory cell is less than the reference voltage applied to the sense amplifier, it generates a binary zero output.

Such prior art memory cells have been used to store multiple voltage levels on the capacitor, e.g., four different potential levels including zero or ground. When reading values from such a memory cell, three sense amplifiers, each with different reference potentials, are required. If none of the sense amplifiers generates an output when the charge on the cell is read, the value in the cell in determined to be zero. If one is on and two off, the value is one, with two on and one off the value is two, and with all three on, the stored value is determined to be a three.

Such prior art multiple level storage memories are problematic because very precise control of voltage is required to distinguish between the various levels stored on the cell. Such precision is difficult to achieve due to the capacitance which appears on the bit lines in the memory. The capacitance can vary, depending upon the value stored in the cells, and can be substantial if many of the cells have charge stored therein, especially if the charge is at the highest level.

It would be desirable to provide a multiple level storage cell capable of storing two or more charge levels from which the values are accurately read without requiring precision voltage control.

SUMMARY OF THE INVENTION

The problems outlined above are in large part solved by a semiconductor memory device having a memory cell which employs two transistors coupled in parallel between a bit line and a storage capacitor, with the gates of both transistors coupled to a word line. The two transistors are constructed so as to have different threshold voltages. During a write operation, the word line is asserted to a potential which turns on at least one of the transistors, allowing the potential on the bit line to be stored on the storage capacitor. In this way, four potentials may be placed on the storage capacitor, representing digital values 0, 1, 2, and 3. During a read operation, the word line is asserted twice. During the first assertion, both transistors turn on if the stored value is 2 or 3, which results in a large sense voltage on the bit line. If the stored value is a 0 or a 1, only the transistor with the smaller threshold voltage is turned on. A stored 0 result in a negligible sense voltage, while a stored 1 results in a moderate sense voltage. The stored values of 2 and 3 are distinguished during the second assertion. The effect that the first assertion has on the stored value is to substantially discharge the capacitor except when the original stored value was 3, in which case a residual charge remains on the storage capacitor. The sense voltage during the second assertion is either negligible or moderate, and in the latter case, it is determined that the stored value was 3.

Broadly speaking, the present invention contemplates a semiconductor memory device having a word line and a bit line and a storage capacitor having first and second ends. A first transistor includes a gate coupled to the word line, a first terminal coupled to the bit line and a second terminal coupled to the first end of the storage capacitor. The gate of a second transistor is also coupled to the word line. The second transistor includes a first terminal coupled to the bit line and a second terminal coupled to the first end of the storage capacitor. In one aspect each transistor has different threshold voltages. The present invention further contemplates a method in which the voltage stored on the capacitor is read in two cycles thereby producing in the first cycle a high level pulse, a low level pulse, or no pulse and in the second cycle, a low level pulse or no pulse, depending upon the level of charge stored on the capacitor.

BRIEF DESCRIPTION OF THE DRAWINGS

Objects and advantages of the invention will become apparent upon reading the following detailed description and upon reference to the accompanying drawings in which.

Figure 1:
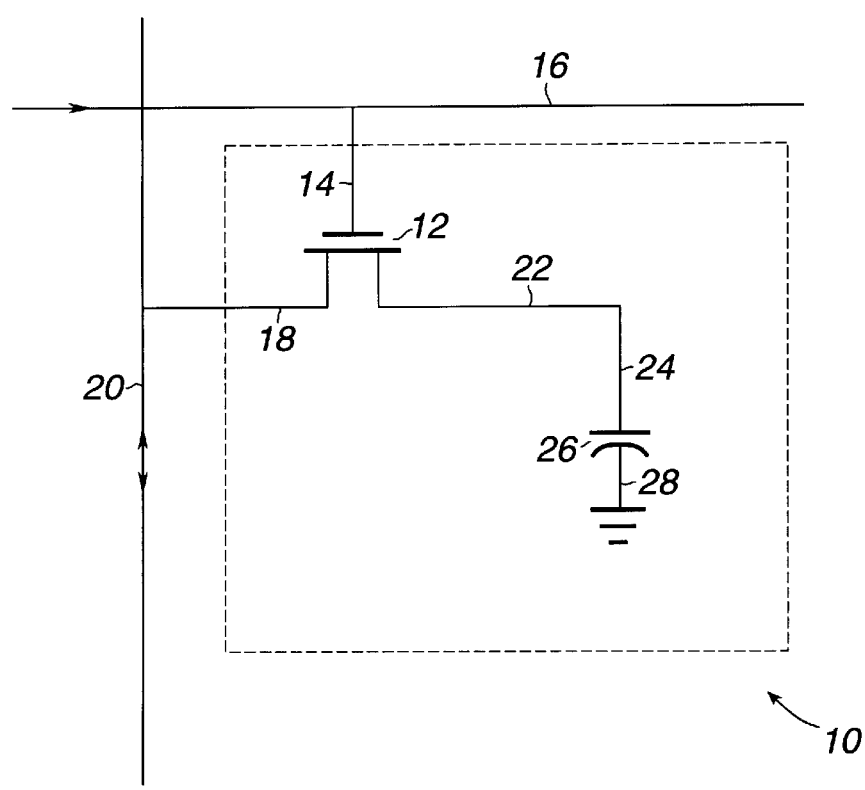
FIG. 1 is a schematic diagram of a prior art DRAM cell.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Indicated generally at 10 in FIG. 1 is a prior art memory cell from a conventional DRAM implemented as an integrated circuit. Cell 10 includes a FEAT 12 having a gate 14 connected to a word line 16. A first terminal 18 of FEAT 12 is connected to a bit line 20 and a second terminal 22 of FEAT 12 is connected to a first end 24 of a trench capacitor 26. A second end 28 of trench capacitor 26 is grounded as indicated in FIG. 1.

When operating to store binary values, word line 16 is raised to a voltage level sufficient to turn on FEAT 12, i.e., to permit conduction between terminals 18, 22. The value to be stored is placed on bit line 20, typically a high voltage level for a binary one and a zero or low voltage level for binary zero. This charges capacitor 26 to the potential on bit line 20. Thereafter, the voltage level on word line 16 is lowered thereby turning FEAT 12 off and maintaining the charge stored on capacitor 26. The potential stored on capacitor 26 is continuously refreshed in a known manner to maintain the charge thereon.

Figure 2:
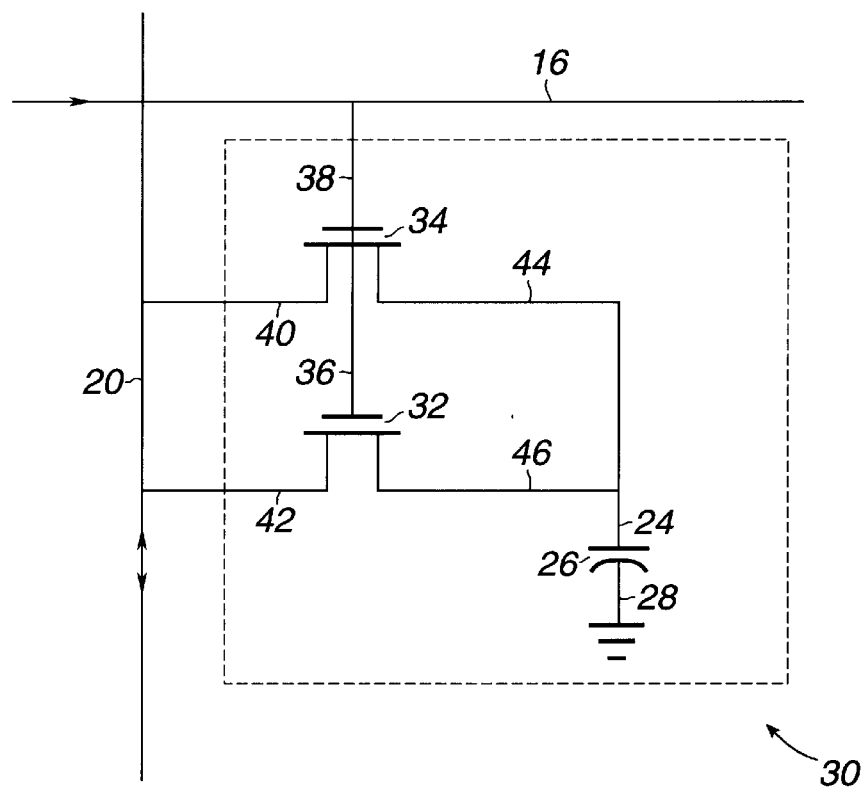
FIG. 2 is a schematic diagram which includes a cell constructed in accordance with the present invention.

As discussed above, some prior art memory cells, like memory cell 10, have been used to store more than a high and low voltage level by charging bit line 20 to one of, e.g., four values, namely a zero, a high value, or one of two intermediate values, one of which is substantially one-third of the high value and the other which is substantially two-thirds of the high value. Although multi level storage cells contain more information in the same semiconductor area as a binary storage cell, problems as described above are associated with such storage techniques. Turning now to FIG. 2, indicated generally at 30, is an integrated circuit incorporating a semiconductor memory device constructed in accordance with the present invention. Structure corresponding to that identified in FIG. 1 is designated by the same numeral in FIG. 2. A pair of FEATS 32, 34 each include a gate 36, 38, respectively, which is connected to word line 16. FEATS 32, 34 are constructed so as to have different threshold voltages. In the present embodiment, FEATS 32, 34 are the insulated-gate type with FEAT 32 having a thicker gate oxide than FEAT 34. This decreases gate capacitance and therefore increases the threshold voltage of FEAT 32. A first terminal 40 of FEAT 34 is connected to bit line 20 as is a first terminal 42 of FEAT 32. A second terminal 44 of FEAT 34 is connected to the first end of trench capacitor 26 as is a second terminal 46 of FEAT 32.

In one embodiment, capacitor 26 stores one of four potential levels generated by a circuit (not shown) which applies a selected one of the potential levels to bit line 20. The four levels include zero or ground representing a zero value and a predetermined potential V representing a value of three. A value of one is represented by ⅓V with a value of two being represented by ⅔V. In another embodiment, the potential levels may vary exponentially, so that the values zero, one, two, and three may be represented by potential levels of 0, ½V, ¾V, and V, respectively. It is noted that in the latter embodiment, the intervals between potential levels grow exponentially, thereby allowing for increased charge leakage rates which may occur at higher potentials.

To store one of the four possible values zero, one, two, or three, the voltage corresponding to that value is first applied by the circuit to bit line 20. Thereafter, word line 16 goes to a high level sufficient to turn on FEATS 32, 34. As described above, transistor 32 has a thicker gate oxide and therefore may not necessarily be turned on when FEAT 34 is on depending upon the potential on terminal 44. In any event, when word line 16 goes to a high level, FEAT 34, with the lowest threshold voltage, is on if the potential applied to bit line 20 represents one, two or three, thereby permitting the potential to charge capacitor 26. After sufficient time to permit charging of capacitor 26 to the potential on bit line 20, word line 16 again goes low thereby maintaining both of FEATS 32, 34 in an off condition and leaving a charge on capacitor 26 which in device 30 is continuously refreshed in a known manner. In another embodiment, the potential is stored on capacitor 26 by (1) setting bit line 20 to a high level, (2) raising word line 16 to a level sufficient to turn on FEATS 32, 34, and (3) lowering the potential on word line 16 after a time calculated to store the desired charge on capacitor 26. In yet another embodiment, the potential on capacitor 26 may be stored in the following manner. To store a zero, bit line 20 is maintained at a low potential while word line 16 is pulsed to a potential sufficient to turn on FEAT 34. To store a one, bit line 20 is maintained at a high potential while word line 16 is pulsed to a potential sufficient to turn on only FEAT 34. To store a two, bit line 20 is maintained at a high potential while word line 16 is pulsed to a potential sufficient to turn on both FEAT 34 and FEAT 32. To store a three, bit line 20 is maintained at a high potential while word line 16 is pulsed twice (or for twice as long as previously described pulses) to a potential sufficient to turn on both FEAT 34 and FEAT 32.

Figures 3, 4:
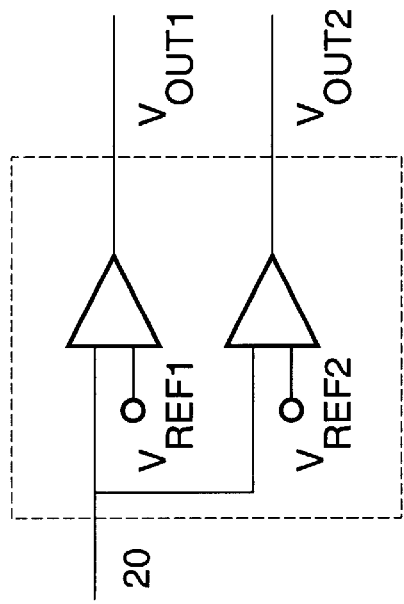
FIG. 3 is a block diagram of a sense amplifier for sensing multiple voltage levels.
FIG. 4 is a table depicting various potential levels and binary states during operation of the circuit show in FIG. 2.

In FIG. 3, a pair of sense amplifiers 48, 50 are connected to bit line 20 as shown. Sense amplifiers 48, 50 are distinguished in that they receive different reference potentials. Sense amplifier 48 is connected to a reference potential $V_{REF}$, while sense amplifier 50 is connected to a reference potential $V_{REF}$. Sense amplifiers 48, 50 are configured to provide output signals $V_{OUT}$, $V_{OUT}$, respectively, which each exist at a low level when the potential of bit line 20 is less than the respective reference potentials, and which are each driven to a high potential when the potential on bit line 20 is greater than the respective reference potentials. The reference potentials are chosen in a manner described further below.

When it is desired to read the value stored on capacitor 26, word line 16 goes to a high level during first and second read cycles as is hereafter explained. Consideration will first be given to the signals appearing on bit line 20 during first and second read cycles, i.e., when two consecutive pulses are applied to word line 16. Referring now to FIG. 4, the first column depicts the value stored on capacitor 26 with a second column depicting the signal levels on bit line 20 during the first and second read cycles. When a zero value is stored on capacitor 26, the potential on bit line 20 does not change during either the first or second read cycle, i.e., each time word line 16 goes to a high level. When a voltage corresponding to a value of one is stored on capacitor 26, during the first read cycle FEAT 34 turns on, due to its lower threshold voltage, but FEAT 32 does not. This results in a transfer of all of the charge on capacitor 26 to bit line 20 thereby creating a pulse having a magnitude $V_1$ as shown in the second column of FIG. 4.

When the potential correspond to a value of two is stored on capacitor 26, both FEATS 32, 34 turn on during the first read cycle and all of the charge is transferred from capacitor 36 to bit line 20 thereby creating a pulse with a magnitude of $V_2$ as depicted in FIG. 4. The length of the first read cycle is chosen to be long enough for substantially all of the charge corresponding to a value of two to be transferred from capacitor 26. Because all of the charge is transferred during the first read cycle, no additional charge is transferred during the second read cycle.

When the highest potential, corresponding to a value of three, is stored on capacitor 26, during the first read cycle both FEATS 32, 34 turn on thereby again producing a pulse with a magnitude of $V_2$ on bit line 20 during the first read cycle. The length of the first read cycle is chosen to be short enough that a charge substantially corresponding to a value of one remains on capacitor 26 at the end of the first read cycle when the original stored charge corresponds to a value of three. Thus, during the second read cycle, shown in FIG. 4, a pulse again having a magnitude of substantially $V_1$ is generated by the remaining charge on capacitor 26.

It is noted that in another embodiment, bit line 20 may be pre charged to Vic and is allowed to discharge through FEATS 32, 34 to capacitor 26. In this embodiment, the voltages generated at the sense amplifier would be ordered oppositely to those described above.

In the preferred embodiment of the invention, $V_{REF}$ is preferably halfway between zero and $V_1$ while $V_{REF}$ is substantially halfway between Vs. And Vs. So selecting the reference voltages results in sense amplifiers 48, 50 producing digital outputs on $V_{OUT}$ and $V_{OUT}$ during the first and second read cycles as shown in FIG. 4. It can be seen that whenever the potential on bit line 20 is above zero sense amplifier 48 is on, i.e., $V_{OUT}$ equals one and whenever the potential on bit line 20 is greater than $V_1$ i.e., $V_2$, sense amplifier 50 is also on.

Figure 5:
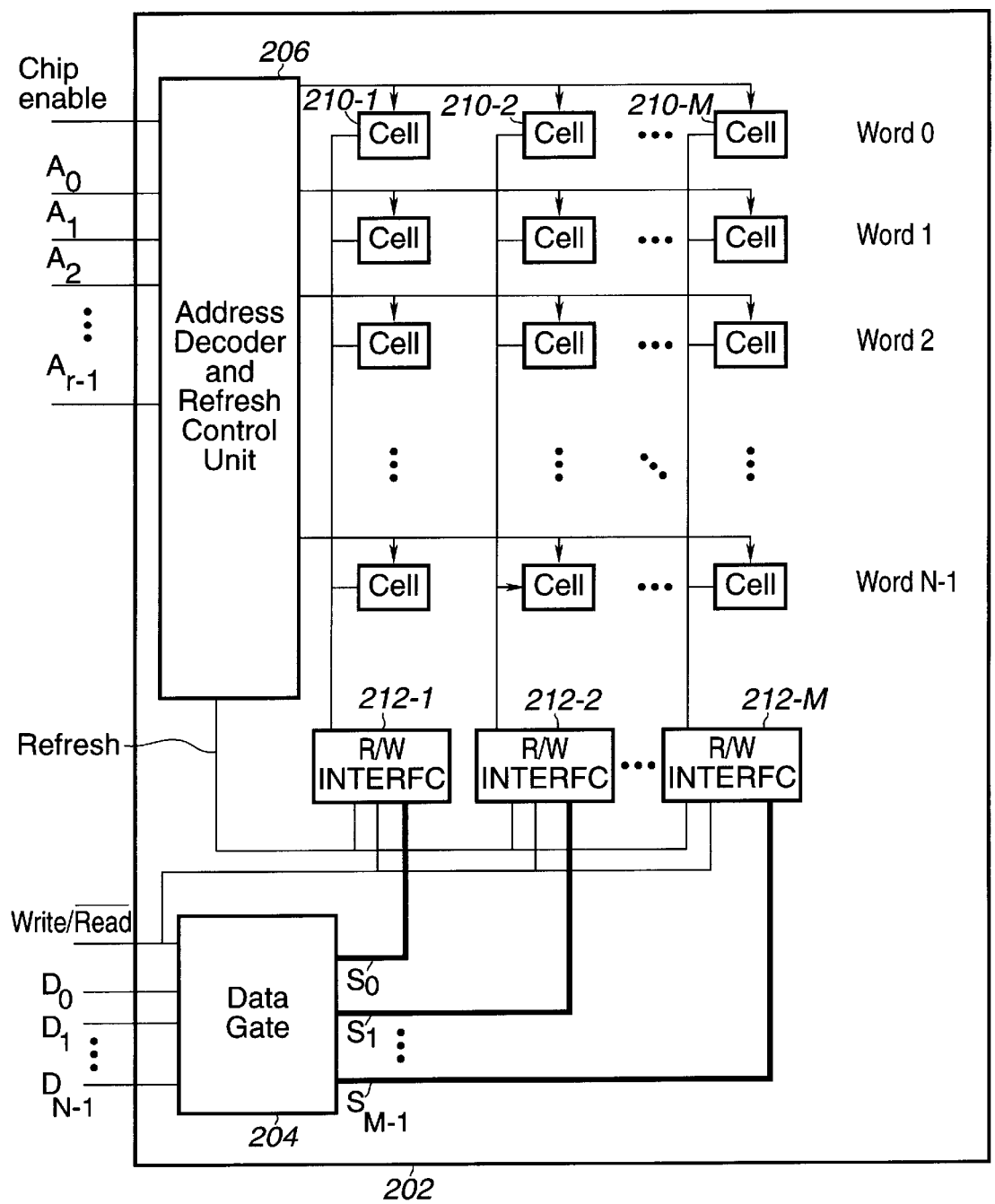
FIG. 5 is a block diagram of an exemplary memory architecture embodying the present invention.

FIG. 5 shows an exemplary memory architecture employing the described cell structure. In this embodiment, a memory 200 has a ground plane 202 surrounding the chip circuitry which shields the circuitry from electromagnetic noise. Memory 200 receives a chip enable signal, a read/write signal, and r address bit signals at an address decoder and refresh unit 206. During operation when the chip enable signal is asserted, address decoder and refresh unit 206 asserts one of $2^r$ word access lines. Each of the word access lines is coupled to a row of memory cells. When a word access line is asserted, the corresponding row of memory cells may be read or written.

Memory 200 also has n bI-directional binary data lines ($D_0$–$D_{n-1}$) connected to a data gate 204. Data gate 204 is coupled to receive the read/write signal and is further coupled to m data paths which carry multi-value logic signals ($S_0$–$S_{m-1}$). Each of the data paths can be driven by either data gate 204 or one of a set read/write interfaces 212-1 through 212-m (referred to collectively as R/W interfaces 212). When memory 200 is in the write mode, each of the data paths provides input to one of R/W interfaces 212. R/W interfaces 212 each convert the multi-value logic signal into a multi-level voltage signal which is coupled by a bit line a corresponding column of memory cells. When memory 200 is in read mode, sense amplifiers in R/W interfaces 212 operate as described previously to generate multi-value logic signals which are driven on the m data paths to data gate 204.

An exemplary memory read operation is now described. Consider a situation in which the address bits are all zero, the write/read control line indicates a read operation, and the chip enable signal is asserted. Upon occurrence of this situation, address decoder and refresh unit 206 asserts the word access line for word 0. This causes cells 210-1 through 210-m to operate as described previously to pass multi-level data signals (in two read cycles) indicative of information stored in the corresponding cells to the bit lines which are coupled to sense amplifiers in R/W interfaces 212. The sense amplifiers operate to detect the stored values and convert the stored values to digital form. The resulting m multi-value logic signals ($S_0$–$S_{m-1}$) are coupled to data gate 204. Data gate 204 converts the m multi-value logic signals ($S_0$–$S_{m-1}$) to n binary digital signals, and drives the n bits on data lines $D_0$–$D_{n-1}$. In this manner, a multi-value logic state stored in each cell may be read.

In one specific implementation, the cells being read are refreshed concurrent with the read operation. For the implementation of FIG. 5, R/W interfaces 212 convert the m multi-value logic signals ($S_0$–$S_{m-1}$) into m multi-level voltage signals and drive them on the bit lines which are coupled to cells 210. At this time the word access line for word 0 is asserted, and cells 210 store the m multi-level voltage signals. In this way, the content of cells 210 can be refreshed every time they are read.

The effectuation of memory write operations is similar. For example, if the address bits are all zero and the write/read control line indicates a write operation when the chip enable signal is asserted, then address decoder and refresh unit 206 asserts the word access line for word 0. Data gate 204 receives data from the bI-directional binary data lines $D_0$–$D_{n-1}$ and converts the data into m multi-value logic signals which are driven onto the m data paths. R/W interfaces 212 convert the input m multi-value logic signals into m multi-level voltage signals and drive the bit lines coupled to the selected cells 210. Having the word access line asserted causes the multi level signal to be stored in cells 210.

Address decoder and refresh unit 206 further includes refresh circuitry to read and refresh the contents of each memory cell within a given time interval. The refresh cycles can be implemented in many ways, one of which is to have them happening continuously while the chip is not enabled. In this implementation method, data gate 204 is disabled and the R/W interfaces 212 are placed in the read/refresh mode described previously by assertion of a refresh signal by address decoder and refresh unit 206. Address decoder and refresh unit 206 may employ a counter which sequentially asserts each word access line, causing a read operation similar to that described previously. In order to assure that each memory cell is refreshed, the chip must spend a specified fraction of a given time interval in the disabled mode.

Figure 6:
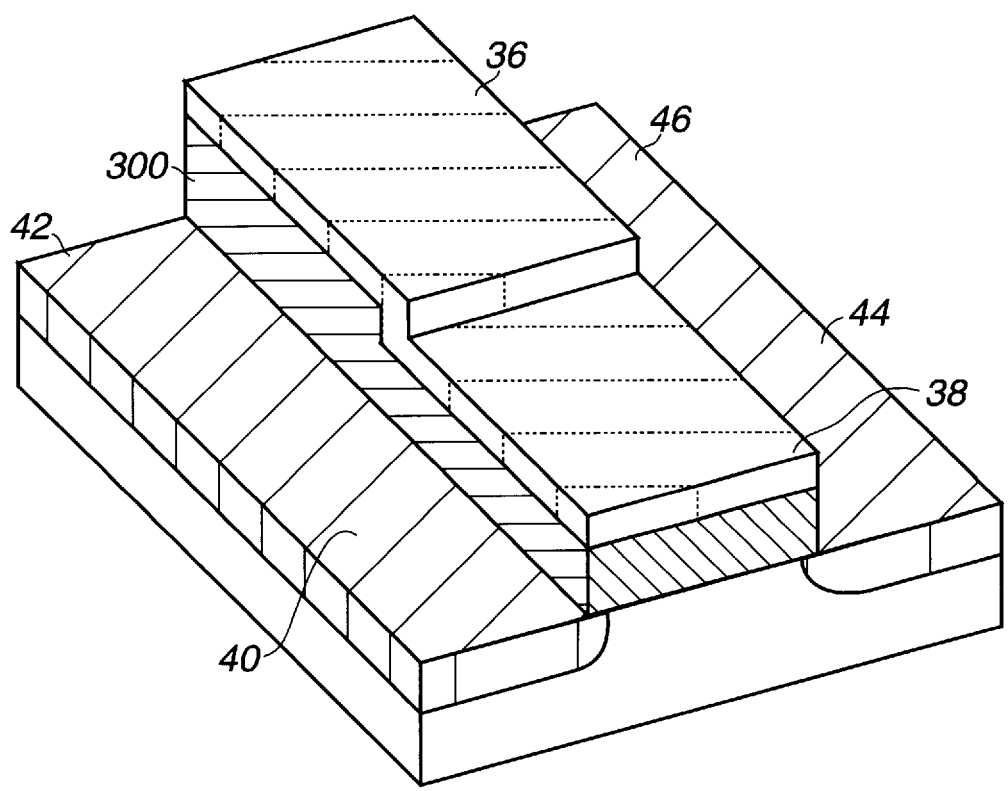
FIG. 6 is an embodiment of a paired transistor implanted in a combined structure.

Accordingly, the present invention provides an accurate method of reading multi level potentials from a memory cell in a maximum of two cycles. It can be appreciated that the inventive concept can be extended to storing a greater or lesser number of selected potential levels than the four depicted in the present embodiment. It is noted that the two transistors of the described memory cell share common source, drain, and gate connections, which allows the described memory cell to be constructed with only a small increase in cell size. As shown in FIG. 6, one embodiment has the paired transistors implemented in a combined structure. The sources 40, 42 are combined, the drains 44, 46 are combined, and the gates 36, 38 are joined. The insulating layer 300 is changes thickness to provide a difference in threshold voltages for two regions of the FEAT channel. No chip area is necessary to isolate the two transistors. Hence this invention advantageously increases the density with which information may be stored in an integrated circuit.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. A semiconductor memory device having a word line and a bit line, said semiconductor memory device comprising:

a storage capacitor having first and second ends;

a first transistor having a gate coupled to said word line, a first terminal coupled to said bit line and a second terminal coupled to said first end of said storage capacitor;

a second transistor having a gate coupled to said word line, a first terminal coupled to said bit line and a second terminal coupled to said first end of said storage capacitor, and a circuit coupled to said bit line, said circuit being operable to apply a selected one of at least three potential levels to said bit line for storing said selected level on said capacitor when at least one of said transistors is conducting.

2. The memory device of claim 1 wherein said first and second transistors have different threshold voltages.

3. The memory device of claim I wherein said first and second transistors each include a layer of gate oxide, said layers having [substantially] different thicknesses.

4. The memory device of claim 1 wherein said capacitor comprises a trench capacitor.

5. The memory device of claim 1 wherein said second end of said capacitor is coupled to a ground potential.

6. The memory device of claim I wherein one of said transistors conducts a larger amount of charge than the other transistor when both are substantially turned on.

7. A method of reading a selected one of at least three potential levels stored on a storage capacitor in a semiconductor memory device having a word line and a bit line, said method comprising:

applying said selected one of at least three potential levels to said bit line to store said selected potential level on said storage capacitor, coupling the potential on said storage capacitor to said bit line for a first gating period having a first predetermined duration;

conducting a first portion of any charge on said storage capacitor to said bit line, sensing a first bit line [the] potential on said bit line [resulting from such coupling];

coupling the potential on said storage capacitor to said bit line for a second gating) period having a second predetermined duration;

conducting a second portion of any remaining charge on said storage capacitor to said bit line; and sensing a second bit line potential on said bit line.

8. The method of claim 8 wherein the step of coupling the potential on said storage capacitor to said bit line comprises turning on a pair of transistors each having a gate connected to said word line, a first terminal coupled to said bit line, and a second terminal coupled to one side of said storage capacitor.

* * * * *